United States Patent
Gu et al.

(10) Patent No.: US 11,930,649 B2
(45) Date of Patent: Mar. 12, 2024

(54) TRANSPARENT TOP ELECTRODE COMPOSITE FILM FOR ORGANIC OPTOELECTRONIC DEVICES AND ITS PREPARATION METHOD

(71) Applicant: University of Electronic Science and Technology of China, Sichuan (CN)

(72) Inventors: Deen Gu, Sichuan (CN); Xin Zhou, Sichuan (CN); Yadong Jiang, Sichuan (CN); Mengru Chen, Sichuan (CN)

(73) Assignee: University of Electronic Science and Technology of China, Sichuan (CN)

( * ) Notice: Subject to any disclaimer, the term of this patent is extended or adjusted under 35 U.S.C. 154(b) by 157 days.

(21) Appl. No.: 17/566,600

(22) Filed: Dec. 30, 2021

(65) Prior Publication Data

US 2022/0123243 A1 Apr. 21, 2022

(30) Foreign Application Priority Data

Aug. 26, 2021 (CN) .......................... 202110987133.2

(51) Int. Cl.
 *H01L 23/00* (2006.01)
 *H10K 30/82* (2023.01)
 *H10K 50/805* (2023.01)
 *H10K 71/60* (2023.01)
 *H10K 102/10* (2023.01)

(52) U.S. Cl.
 CPC ........... *H10K 30/82* (2023.02); *H10K 50/805* (2023.02); *H10K 71/60* (2023.02); *H10K 2102/101* (2023.02)

(58) Field of Classification Search
 CPC ...... H10K 30/82; H10K 50/805; H10K 71/60; H10K 2102/101
 See application file for complete search history.

(56) References Cited

U.S. PATENT DOCUMENTS

2020/0006655 A1\* 1/2020 Tang ..................... H01L 23/544

\* cited by examiner

*Primary Examiner* — Anthony Ho

(57) ABSTRACT

A transparent top electrode composite film for organic optoelectronic devices includes a substrate, an $MoO_x$ film layer coated on the substrate, a doped Ag-based film layer coated on the $MoO_x$ film layer and an $HfO_x$ film layer coated on the doped Ag-based film layer. A preparation method of the transparent top electrode composite film, which is achieved under vacuum and low temperature, includes steps of (A) depositing an $MoO_x$ film layer on a substrate through thermal evaporation process or electron beam evaporation process without heating the substrate; (B) depositing a doped Ag-based film layer on the $MoO_x$ film layer through sputtering process or evaporation process; and (C) depositing an $HfO_x$ film layer on the doped Ag-based film layer through reactive sputtering process, thereby obtaining the transparent top electrode composite film. The composite film is able to be used as a top electrode material for organic optoelectronic devices.

12 Claims, 4 Drawing Sheets ated priority under 35 U.S.C.

TRANSPARENT TOP ELECTRODE COMPOSITE FILM FOR ORGANIC OPTOELECTRONIC DEVICES AND ITS PREPARATION METHOD

CROSS REFERENCE OF RELATED APPLICATION

The present invention claims priority under 35 U.S.C. 119(a-d) to CN 202110987133.2, filed Aug. 26, 2021.

BACKGROUND OF THE PRESENT INVENTION

Field of Invention

The present invention relates to the technology field of transparent electrode film for organic optoelectronic devices, and more particularly to a transparent top electrode composite film for organic optoelectronic devices and a preparation method of the transparent top electrode composite film.

Description of Related Arts

With the continuous exploration of organic semiconductor materials, organic optoelectronic devices have emerged. After years of research, organic optoelectronic devices have developed rapidly. Compared with inorganic photoelectric devices, organic photoelectric devices have the characteristics of high durability, high flexibility and low cost. In addition to the application in wearable electronic devices, organic optoelectronic devices are also widely used in artificial vision, night vision, optical communication network, biomedicine and other fields.

Typical organic photoelectric devices are organic photodetectors, OLEDs, organic solar cells and other devices. The classic structure of these devices are as follows: a top electrode, a hole transport layer or an electron blocking layer, an active layer, an electron transport layer or a hole transport layer and a bottom electrode. The arraying of organic devices usually needs to be integrated with a CMOS (Complementary Metal Oxide Semiconductor) signal processing circuit to enhance the performance of the device. In order to integrate with the CMOS circuit, the bottom electrode of the organic optoelectronic device should be interconnected with the CMOS circuit. Therefore, the top electrode of the organic optoelectronic device must have good transmittance and conductivity.

Transparent conductive films are able to be used not only in the above-mentioned organic optoelectronic devices, but also in solar cells, flexible solar cells, architectural coatings, touch screens, flat panel display devices, and flexible LCDs. Commonly used transparent conductive films are transparent conductive oxide films such as ITO, metal nanowire films, and ultra-thin metal films. Among them, the transparent conductive oxide films and the ultra-thin metal films are suitable for large-area and batch preparation, and especially for application in bulk organic devices. The photoelectric properties of transparent oxide conductive (TCO) films such as ITO are closely related to the deposition temperature of the films. Generally speaking, the higher the deposition temperature, the higher the transmittance and conductivity of TCO films. For organic optoelectronic devices, the organic active layer is usually unable to withstand high temperatures, if a transparent conductive oxide film such as ITO is used as a top electrode, the transmittance and conductivity of the transparent conductive oxide film such as ITO are decreased due to the limitation of process temperature, thereby affecting the performance of organic optoelectronic devices.

When the metal film is less in the thickness, it has good transmittance and high conductivity, and it is usually able to be prepared at a lower process temperature. However, due to the characteristics of the metal film itself, the transmittance of the ultra-thin metal film in the longer wavelength direction will gradually decrease as the wavelength increases, resulting in a lower average transmittance of the ultra-thin metal film in the range from visible light to near-infrared light. Therefore, in order to meet the needs of the development of high-performance organic optoelectronic devices, it is urgent to develop a new transparent conductive film, which has high average transmittance in the range from visible light to near-infrared light, and is compatible with organic materials in process temperature (no more than 120° C.).

SUMMARY OF THE PRESENT INVENTION

A technical problem to be solved of the present invention is to provide a transparent top electrode composite film with high transmittance and excellent conductivity, which is able to be prepared not more than 120° C., so that it is suitable for the development of high-performance organic optoelectronic devices integrated with CMOS circuits.

To solve the above technical problem, the present invention provides technical solutions as follows.

The present invention provides a transparent top electrode composite film for organic optoelectronic devices, the transparent top electrode composite film comprising a substrate, an $MoO_x$ film layer coated on the substrate, a doped Ag-based film layer coated on the $MoO_x$ film layer and an $HfO_x$ film layer coated on the doped Ag-based film layer.

Preferably, an atomic mass percentage of a doping element in the doped Ag-based film layer is in a range of 2-10%, and an atomic mass percentage of Ag element in the doped Ag-based film layer is in a range of 90-98%.

More preferably, the doping element is at least one member selected from the group consisting of Cu, Al, Mo and V.

More preferably, a thickness of the doped Ag-based film layer is in a range of 8-15 nm.

Preferably, an atomic mass percentage of Mo element in the $MoO_x$ film layer is in a range of 25-30%, an atomic mass percentage of oxygen element in the $MoO_x$ film layer is in a range of 70-75%.

More preferably, a thickness of the $MoO_x$ film layer is in a range of 10-50 nm.

Preferably, an atomic mass percentage of Hf element in the $HfO_x$ film layer is in a range of 33-38%, an atomic mass percentage of oxygen element in the $HfO_x$ film layer is in a range of 62-67%.

More preferably, a thickness of the $HfO_x$ film layer is in a range of 50-150 nm.

Also, the present invention provides a preparation method of the above-mentioned transparent top electrode composite film for organic optoelectronic devices. The preparation method, which is achieved under vacuum and low temperature, comprises steps of:

(A) putting a substrate into a first vacuum chamber of a vacuum thermal evaporation device or an electron beam evaporation device, vacuumizing, and depositing an $MoO_x$ film layer on the substrate through thermal evaporation process or electron beam evaporation process without heating the substrate;

(B) putting the substrate deposited with the MoO$_x$ film layer into a sputtering chamber or a second vacuum chamber of the vacuum thermal evaporation device, vacuumizing, and depositing a doped Ag-based film layer on the MoO$_x$ film layer through sputtering process or evaporation process, wherein a temperature of the substrate deposited with the MoO$_x$ film layer is in a range of 20–60° C.; and (C) putting the substrate deposited with the MoO$_x$ film layer and the doped Ag-based film layer into a magnetron sputtering compartment, vacuumizing, and depositing an HfO$_x$ film layer on the doped Ag-based film layer through reactive sputtering process, wherein a temperature of the substrate deposited with the MoO$_x$ film layer and the doped Ag-based film layer is in a range of 20-100° C., thereby obtaining the transparent top electrode composite film.

Preferably, in the step (A), vacuumizing till a background vacuum pressure in the first vacuum chamber ≤1×10$^{-4}$ Pa.

More preferably, in the step (A), depositing the MoO$_x$ film layer at a deposition rate in a range of 0.03-1.5 Å/s.

More preferably, in the step (A), a thickness of the MoO$_x$ film layer is in a range of 10-50 nm.

More preferably, in the step (A), an atomic mass percentage of Mo element in the MoO$_x$ film layer is in a range of 25-30%, an atomic mass percentage of oxygen element in the MoO$_x$ film layer is in a range of 70-75%.

Preferably, in the step (B), when the sputtering process is adopted, vacuumizing till a background vacuum pressure in the sputtering chamber ≤2×10$^{-3}$ Pa.

More preferably, in the step (B), depositing the doped Ag-based film layer at a deposition rate in a range of 1-10 Å/s.

Preferably, in the step (B), when the evaporation process is adopted, vacuumizing till a background vacuum pressure in the second vacuum chamber ≤1×10$^{-4}$ Pa.

More preferably, in the step (B), depositing the doped Ag-based film layer at a deposition rate in a range of 0.1-3 Å/s.

More preferably, in the step (B), a thickness of the doped Ag-based film layer is in a range of 8-15 nm.

More preferably, in the step (B), an atomic mass percentage of a doping element in the doped Ag-based film layer is in a range of 2-10%, and an atomic mass percentage of Ag element in the doped Ag-based film layer is in a range of 90-98%.

More preferably, in the step (B), the doping element is at least one member selected from the group consisting of Cu, Al, Mo and V.

Preferably, in the step (C), vacuumizing till a background vacuum pressure in the magnetron sputtering compartment ≤3×10$^{-3}$ Pa.

More preferably, in the step (C), depositing the HfO$_x$ film layer at a deposition rate in a range of 1-5 Å/s.

More preferably, in the step (C), a thickness of the HfO$_x$ film layer is in a range of 50-150 nm.

More preferably, an atomic mass percentage of Hf element in the HfO$_x$ film layer is in a range of 33-38%, an atomic mass percentage of oxygen element in the HfO$_x$ film layer is in a range of 62-67%.

Beneficial effects of the present invention are as follows.

(1) The composite film provided by the present invention has a multi-layer composite structure, which comprises the substrate, the MoO$_x$ film layer coated on the substrate, the doped Ag-based film layer coated on the MoO$_x$ film layer, and an HfO$_x$ film layer coated on the doped Ag-based film layer. The composite film has high transmittance and small sheet resistance, which is able to be used as a top electrode material for organic optoelectronic devices.

(2) The preparation method of the transparent top electrode composite film provided by the present invention has a simple preparation process, is able to be realized by thermal evaporation, electron beam evaporation, sputtering, and reactive sputtering processes, and is suitable for batch preparation of large-area organic optoelectronic devices.

(3) The transparent top electrode composite film provided by the present invention is prepared not more than 100° C. in a vacuum environment, which is able to be fully compatible with the organic active layer of organic optoelectronic devices.

(4) The transparent top electrode composite film provided by the present invention has high average transmittance in a light wave range from the visible light to the near-infrared light (380 nm-1100 nm), up to 77%, which is significantly higher than the average transmittance of the doped Ag-based transparent conductive film (40-50%). The transparent top electrode composite film has good conductivity and a sheet resistance in a range of 10-20 Ω/□.

BRIEF DESCRIPTION OF THE DRAWINGS

In order to explain the technical solutions of the embodiments of the present invention more clearly, the drawings needed in the embodiments will be briefly introduced as follows. Obviously, the drawings described below are only some embodiments of the present invention. For those skilled in the art, other drawings are able to be obtained from these drawings without creative work.

Figure 1:
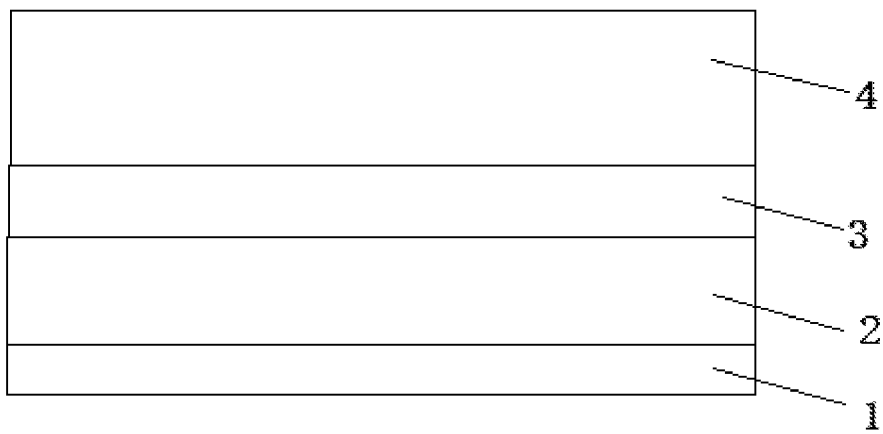
FIG. 1 is a structurally schematic view of a transparent top electrode composite film for organic optoelectronic devices provided by the present invention.

In the drawings, 1: substrate; 2: $MoO_x$ film layer; 3: doped Ag-based film layer; 4: $HfO_x$ film layer.

DETAILED DESCRIPTION OF THE PREFERRED EMBODIMENT

The present invention is further explained with specific embodiments as follows. It should be noted that these embodiments are only to describe the present invention more directly, are only a part of the present invention and are unable to constitute any limitation on the present invention.

Referring to FIG. 1, a transparent top electrode composite film for organic optoelectronic devices is illustrated. The transparent top electrode composite film comprises a substrate 1, an $MoO_x$ film layer 2 coated on the substrate 1, a doped Ag-based film layer 3 coated on the $MoO_x$ film layer 2 and an $HfO_x$ film layer 4 coated on the doped Ag-based film layer 3.

Preferably, the substrate 1 is able to be a quartz substrate, a quartz substrate with an organic functional layer, an indium tin oxide (ITO) substrate with an organic functional layer, or a silicon wafer with an organic functional layer. In order to accurately evaluate the performance parameters (transmittance and sheet resistance) of the transparent top electrode composite film, the quartz substrate is used as the substrate in the following embodiments. However, the substrate, which is used in the transparent top electrode composite film and the preparation method thereof provided by the present invention, is not limited to a quartz substrate, but also is able to be a quartz substrate with an organic functional layer, a silicon wafer with an organic functional layer, or an ITO substrate with an organic functional layer.

Preferably, an atomic mass percentage of a doping element in the doped Ag-based film layer 3 is in a range of 2-10%, and an atomic mass percentage of Ag element in the doped Ag-based film layer 3 is in a range of 90-98%. More preferably, the doping element is at least one member selected from the group consisting of Cu, Al, Mo and V. More preferably, a thickness of the doped Ag-based film layer 3 is in a range of 8-15 nm.

Preferably, an atomic mass percentage of Mo element in the $MoO_x$ film layer 2 is in a range of 25-30%, an atomic mass percentage of oxygen element in the $MoO_x$ film layer 2 is in a range of 70-75%. More preferably, a thickness of the $MoO_x$ film layer 2 is in a range of 10-50 nm.

Preferably, an atomic mass percentage of Hf element in the $HfO_x$ film layer 4 is in a range of 33-38%, an atomic mass percentage of oxygen element in the $HfO_x$ film layer 4 is in a range of 62-67%. More preferably, a thickness of the $HfO_x$ film layer 4 is in a range of 50-150 nm.

Also, the present invention provides a preparation method of the transparent top electrode composite film mentioned above. The preparation method comprises steps as follows.

During the deposition of $MoO_x$ film layer 2, the atomic mass percentage of Mo element in the $MoO_x$ film layer 2 is controlled in the range of 25-30% by controlling compositions of raw materials used in thermal evaporation process or electron beam evaporation process.

In the sputtering process of depositing the doped Ag-based film layer 3, the doping element in the doped Ag-based film layer 3 is introduced to co-sputter with the existing dual-target (the Ag target and the doping element metal target are sputtered at the same time), or the Ag-based composite target embedded with the doping element metal block is sputtered. If the evaporation process is adopted, the doping element in the doped Ag-based film layer is introduced into the existing evaporation to perform dual-source co-evaporation.

Generally, during the deposition of doped Ag-based film layer 3, if the sputtering process is adopted, when the doping element is introduced by dual-target co-sputtering, the atomic mass percentage of the doping element in the doped Ag-based film layer 3 is able to be adjusted by adjusting the sputtering power ratio of the doping element target and the Ag target; when the doping element is introduced by sputtering of Ag-based composite target embedded with the doping element metal block, the atomic mass percentage of the doping element in the doped Ag-based film layer 3 is able to be adjusted by adjusting the projected area ratio of the doping element metal block to the Ag target. If the evaporation process is adopted, the atomic mass percentage of the doping element in the doped Ag-based film layer 3 is adjusted by adjusting the evaporation rate ratio of the doping element source and the Ag source in dual-source evaporation.

During the deposition of $HfO_x$ film layer 4, the atomic mass percentage of Hf element in the $HfO_x$ film layer 4 is controlled in the range of 33-38% by controlling the flow ratio of oxygen to argon during reactive sputtering process.

First Embodiment

Firstly, put a clean quartz substrate into a vacuum chamber of a vacuum thermal evaporation device, vacuumize till a background vacuum pressure in the vacuum chamber $\leq 1 \times 10^{-4}$ Pa, and deposit an $MoO_x$ (x=2.9) film layer with a thickness of 10 nm on the quartz substrate at a deposition rate in a range of 0.03-0.05 Å/s without heating the quartz substrate.

Secondly, put the quartz substrate deposited with the $MoO_x$ film layer into a sputtering chamber, vacuumize till a background vacuum pressure in the sputtering chamber $\leq 2 \times 10^{-3}$ Pa, and deposit a Cu-doped Ag-based film layer (which is recorded as Ag—Cu film layer) on the $MoO_x$ film layer at a deposition rate of 1.6 Å/s through dual-target co-sputtering process, wherein an atomic mass percentage of Cu element in the Ag—Cu film layer is 5%, a temperature of the quartz substrate deposited with the $MoO_x$ film layer is 35° C., and a thickness of the Ag—Cu film layer is 8 nm.

Thirdly, put the quartz substrate deposited with the $MoO_x$ film layer and the Ag—Cu film layer into a magnetron sputtering compartment, vacuumize till a background vacuum pressure in the magnetron sputtering compartment $\leq 3 \times 10^{-3}$ Pa, wherein a temperature of the quartz substrate deposited with the $MoO_x$ film layer and the Ag—Cu film layer is 50° C., and deposit an $HfO_x$ (x=1.8) film layer with a thickness of 100 nm on the Ag—Cu film layer at a deposition rate of 1.97 Å/s through reactive sputtering process, thereby obtaining an $MoO_x$/Ag—Cu/$HfO_x$ composite film.

Figure 2:
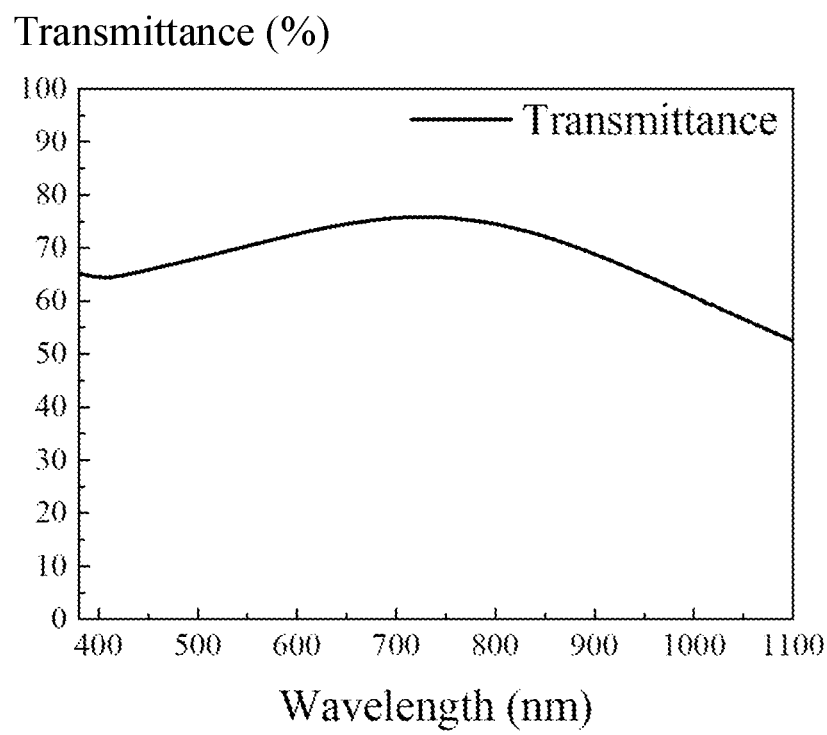
FIG. 2 is a transmission spectrum of an MoO$_x$/Ag—Cu/HfO$_x$ composite film according to a first embodiment of the present invention in a light wave range from the visible light to the near-infrared light.

Take out the $MoO_x$/Ag—Cu/$HfO_x$ composite film and measure a sheet resistance of the $MoO_x$/Ag—Cu/$HfO_x$ composite film to be 14.8Ω/□ with four-probe. The transmission spectrum from the visible light to the near-infrared light (380 nm-1100 nm) is tested with a spectrometer, referring to FIG. 2. According to data of the transmission spectrum, the average transmittance from the visible light to the near-infrared light, in a range of 380 nm-1100 nm, is 68.4% through arithmetic mean method.

Second Embodiment

Firstly, put a clean quartz substrate into a vacuum chamber of a vacuum thermal evaporation device, vacuumize till a background vacuum pressure in the vacuum chamber ≤1×10$^{-4}$ Pa, and deposit an MoO$_x$ (x=2.9) film layer with a thickness of 10 nm on the quartz substrate at a deposition rate in a range of 0.03-0.05 Å/s without heating the quartz substrate.

Secondly, put the quartz substrate deposited with the MoO$_x$ film layer into a sputtering chamber, vacuumize till a background vacuum pressure in the sputtering chamber ≤2×10$^{-3}$ Pa, and deposit a Cu-doped Ag-based film layer (which is recorded as Ag—Cu film layer) on the MoO$_x$ film layer at a deposition rate of 1.6 Å/s through dual-target co-sputtering process, wherein an atomic mass percentage of Cu element in the Ag—Cu film layer is 5%, a temperature of the quartz substrate deposited with the MoO$_x$ film layer is 50° C., and a thickness of the Ag—Cu film layer is 8 nm.

Thirdly, put the quartz substrate deposited with the MoO$_x$ film layer and the Ag—Cu film layer into a magnetron sputtering compartment, vacuumize till a background vacuum pressure in the magnetron sputtering compartment ≤3×10$^{-3}$ Pa, wherein a temperature of the quartz substrate deposited with the MoO$_x$ film layer and the Ag—Cu film layer is 100° C., and deposit an HfO$_x$ (x=1.9) film layer with a thickness of 50 nm on the Ag—Cu film layer at a deposition rate of 1.97 Å/s through reactive sputtering process, thereby obtaining an MoO$_x$/Ag—Cu/HfO$_x$ composite film.

Figure 3:
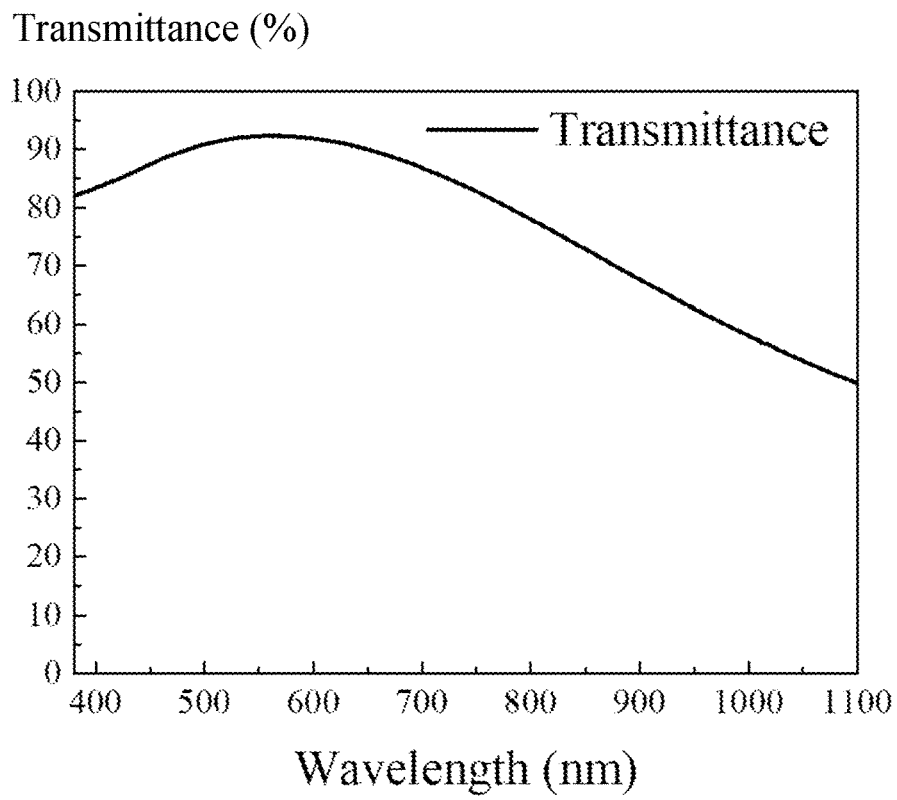
FIG. 3 is a transmission spectrum of an MoO$_x$/Ag—Cu/HfO$_x$ composite film according to a second embodiment of the present invention in a light wave range from the visible light to the near-infrared light.

Take out the MoO$_x$/Ag—Cu/HfO$_x$ composite film and measure a sheet resistance of the MoO$_x$/Ag—Cu/HfO$_x$ composite film to be 15.9Ω/□ with four-probe. The transmission spectrum from the visible light to the near-infrared light (380 nm-1100 nm) is tested with a spectrometer, referring to FIG. 3. According to data of the transmission spectrum, in a range of 380 nm-1100 nm, the average transmittance from the visible light to the near-infrared light is 77.4% through arithmetic mean method.

Third Embodiment

Firstly, put a clean quartz substrate into a vacuum chamber of a vacuum thermal evaporation device, vacuumize till a background vacuum pressure in the vacuum chamber ≤1×10$^{-4}$ Pa, and deposit an MoO$_x$ (x=2.5) film layer with a thickness of 10 nm on the quartz substrate at a deposition rate in a range of 0.03-0.05 Å/s without heating the quartz substrate.

Secondly, put the quartz substrate deposited with the MoO$_x$ film layer into a sputtering chamber, vacuumize till a background vacuum pressure in the sputtering chamber ≤2×10$^{-3}$ Pa, and deposit a Cu-doped Ag-based film layer (which is recorded as Ag—Cu film layer) on the MoO$_x$ film layer at a deposition rate of 10 Å/s by sputtering of Ag-based composite target embedded with Cu metal block, wherein an atomic mass percentage of Cu element in the Ag—Cu film layer is 2%, a temperature of the quartz substrate deposited with the MoO$_x$ film layer is 20° C., and a thickness of the Ag—Cu film layer is 15 nm.

Thirdly, put the quartz substrate deposited with the MoO$_x$ film layer and the Ag—Cu film layer into a magnetron sputtering compartment, vacuumize till a background vacuum pressure in the magnetron sputtering compartment ≤3×10$^{-3}$ Pa, wherein a temperature of the quartz substrate deposited with the MoO$_x$ film layer and the Ag—Cu film layer is 20° C., and deposit an HfO$_x$ (x=1.7) film layer with a thickness of 150 nm on the Ag—Cu film layer at a deposition rate of 1.97 Å/s through reactive sputtering process, thereby obtaining an MoO$_x$/Ag—Cu/HfO$_x$ composite film.

Figure 4:
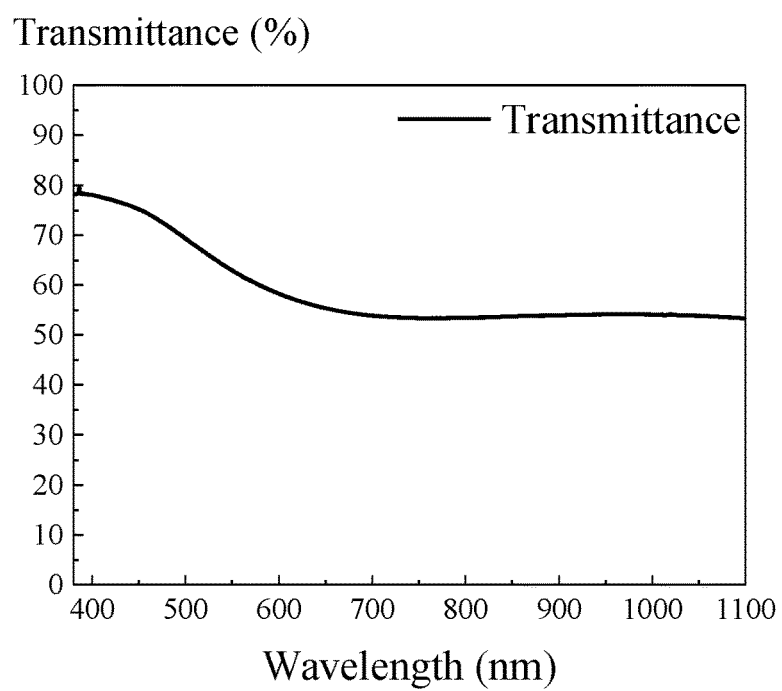
FIG. 4 is a transmission spectrum of an MoO$_x$/Ag—Cu/HfO$_x$ composite film according to a third embodiment of the present invention in a light wave range from the visible light to the near-infrared light.

Take out the MoO$_x$/Ag—Cu/HfO$_x$ composite film and measure a sheet resistance of the MoO$_x$/Ag—Cu/HfO$_x$ composite film to be 14.2Ω/□ with four-probe. The transmission spectrum from the visible light to the near-infrared light (380 nm-1100 nm) is tested with a spectrometer, referring to FIG. 4. According to data of the transmission spectrum, in a range of 380 nm-1100 nm, the average transmittance from the visible light to the near-infrared light is 59% through arithmetic mean method.

Fourth Embodiment

Firstly, put a clean quartz substrate into a vacuum chamber of an electron beam evaporation device, vacuumize till a background vacuum pressure in the vacuum chamber ≤1×10$^{-4}$ Pa, and deposit an MoO$_x$ (x=2.8) film layer with a thickness of 50 nm on the quartz substrate at a deposition rate in a range of 0.5-1.0 Å/s through electron beam evaporation process without heating the quartz substrate.

Secondly, put the quartz substrate deposited with the MoO$_x$ film layer into a sputtering chamber, vacuumize till a background vacuum pressure in the sputtering chamber ≤2×10$^{-3}$ Pa, and deposit a V-doped Ag-based film layer (which is recorded as Ag—V film layer) on the MoO$_x$ film layer at a deposition rate of 3.0 Å/s by sputtering of Ag-based composite target embedded with vanadium metal block, wherein an atomic mass percentage of V element in the Ag—V film layer is 5%, a temperature of the quartz substrate deposited with the MoO$_x$ film layer is 60° C., and a thickness of the Ag—V film layer is 12 nm.

Thirdly, put the quartz substrate deposited with the MoO$_x$ film layer and the Ag—V film layer into a magnetron sputtering compartment, vacuumize till a background vacuum pressure in the magnetron sputtering compartment ≤3×10$^{-3}$ Pa, wherein a temperature of the quartz substrate deposited with the MoO$_x$ film layer and the Ag—V film layer is 50° C., and deposit an HfO$_x$ (x=1.8) film layer with a thickness of 50 nm on the Ag—V film layer at a deposition rate of 1.0 Å/s through reactive sputtering process, thereby obtaining an MoO$_x$/Ag—V/HfO$_x$ composite film.

Figure 5:
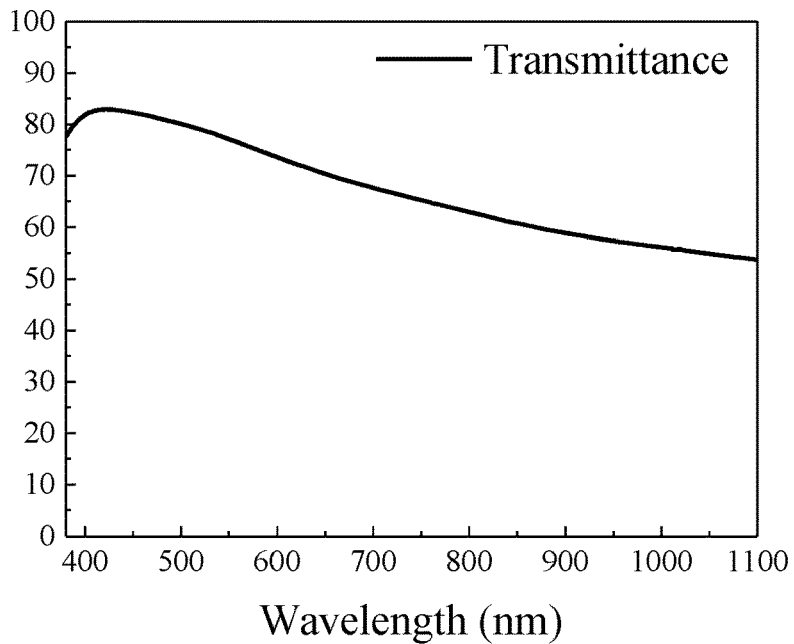
FIG. 5 is a transmission spectrum of an MoO$_x$/Ag—V/HfO$_x$ composite film according to a fourth embodiment of the present invention in a light wave range from the visible light to the near-infrared light.

Take out the MoO$_x$/Ag—V/HfO$_x$ composite film and measure a sheet resistance of the MoO$_x$/Ag—V/HfO$_x$ composite film to be 14.4Ω/□ with four-probe. The transmission spectrum from the visible light to the near-infrared light (380 nm-1100 nm) is tested with a spectrometer, referring to FIG. 5. According to data of the transmission spectrum, in a range of 380 nm-1100 nm, the average transmittance from the visible light to the near-infrared light is 67.2% through arithmetic mean method.

Fifth Embodiment

Firstly, put a clean quartz substrate into a vacuum chamber of an electron beam evaporation device, vacuumize till a background vacuum pressure in the vacuum chamber ≤1×10$^{-4}$ Pa, and deposit an MoO$_x$ (x=2.9) film layer with a thickness of 50 nm on the quartz substrate at a deposition rate in a range of 0.6-1.2 Å/s without heating the quartz substrate.

Secondly, put the quartz substrate deposited with the MoO$_x$ film layer into a sputtering chamber, vacuumize till a background vacuum pressure in the sputtering chamber ≤1×10$^{-4}$ Pa, and deposit an Mo-doped Ag-based film layer (which is recorded as Ag—Mo film layer) on the MoO$_x$ film layer at a deposition rate of 2.5 Å/s through dual-source electron beam evaporation process, wherein an atomic mass percentage of Mo element in the Ag—Mo film layer is 10%, a temperature of the quartz substrate deposited with the MoO$_x$ film layer is 60° C., and a thickness of the Ag—Mo film layer is 12 nm.

Thirdly, put the quartz substrate deposited with the MoO$_x$ film layer and the Ag—Mo film layer into a magnetron sputtering compartment, vacuumize till a background vacuum pressure in the magnetron sputtering compartment ≤3×10$^{-3}$ Pa, wherein a temperature of the quartz substrate deposited with the MoO$_x$ film layer and the Ag—Mo film layer is 50° C., and deposit an HfO$_x$ (x=2.0) film layer with a thickness of 100 nm on the Ag—Mo film layer at a deposition rate of 1.2 Å/s through reactive sputtering process, thereby obtaining an MoO$_x$/Ag—Mo/HfO$_x$ composite film.

Figure 6:
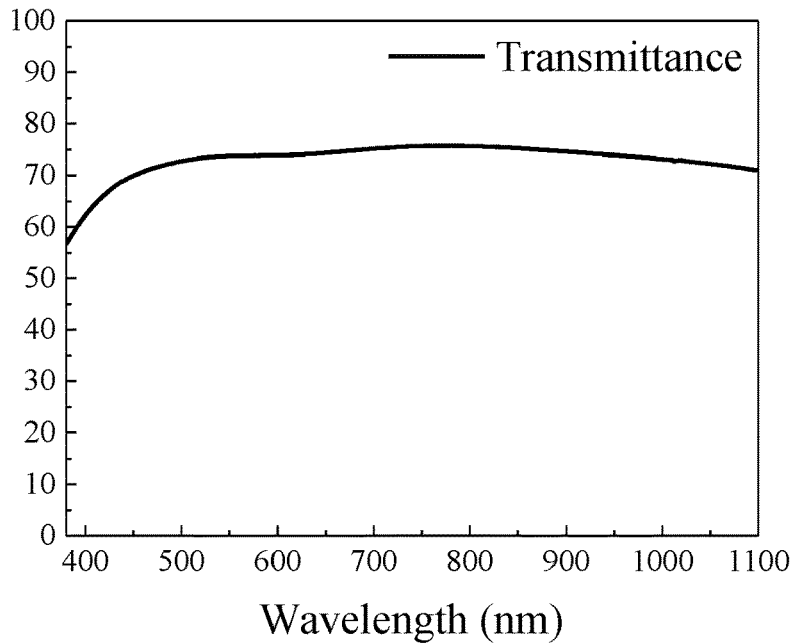
FIG. 6 is a transmission spectrum of an MoO$_x$/Ag—Mo/HfO$_x$ composite film according to a fifth embodiment of the present invention in a light wave range from the visible light to the near-infrared light.

Take out the MoO$_x$/Ag—Mo/HfO$_x$ composite film and measure a sheet resistance of the MoO$_x$/Ag—Mo/HfO$_x$ composite film to be 11.5Ω/□ with four-probe. The transmission spectrum from the visible light to the near-infrared light (380 nm-1100 nm) is tested with a spectrometer, referring to FIG. 6. According to data of the transmission spectrum, in a range of 380 nm-1100 nm, the average transmittance from the visible light to the near-infrared light is 73% through arithmetic mean method.

Sixth Embodiment

Firstly, put a clean quartz substrate into a first vacuum chamber of a vacuum thermal evaporation device, vacuumize till a background vacuum pressure in the first vacuum chamber ≤1×10$^{-4}$ Pa, and deposit an MoO$_x$ (x=2.9) film layer with a thickness of 50 nm on the quartz substrate at a deposition rate in a range of 0.8-1.5 Å/s without heating the quartz substrate.

Secondly, put the quartz substrate deposited with the MoO$_x$ film layer into a second vacuum chamber of the vacuum thermal evaporation device, vacuumize till a background vacuum pressure in the second vacuum chamber ≤1×10$^{-4}$ Pa, and deposit an Al-doped Ag-based film layer (which is recorded as Ag—Al film layer) on the MoO$_x$ film layer at a deposition rate of 0.1 Å/s through dual-source thermal evaporation process, wherein an atomic mass percentage of Al element in the Ag—Al film layer is 5%, a temperature of the quartz substrate deposited with the MoO$_x$ film layer is 35° C., and a thickness of the Ag—Al film layer is 8 nm.

Thirdly, put the quartz substrate deposited with the MoO$_x$ film layer and the Ag—Al film layer into a magnetron sputtering compartment, vacuumize till a background vacuum pressure in the magnetron sputtering compartment ≤3×10$^{-3}$ Pa, wherein a temperature of the quartz substrate deposited with the MoO$_x$ film layer and the Ag—Al film layer is 50° C., and deposit an HfO$_x$ (x=1.7) film layer with a thickness of 150 nm on the Ag—Al film layer at a deposition rate of 5.0 Å/s through reactive sputtering process, thereby obtaining an MoO$_x$/Ag—Al/HfO$_x$ composite film.

Figure 7:
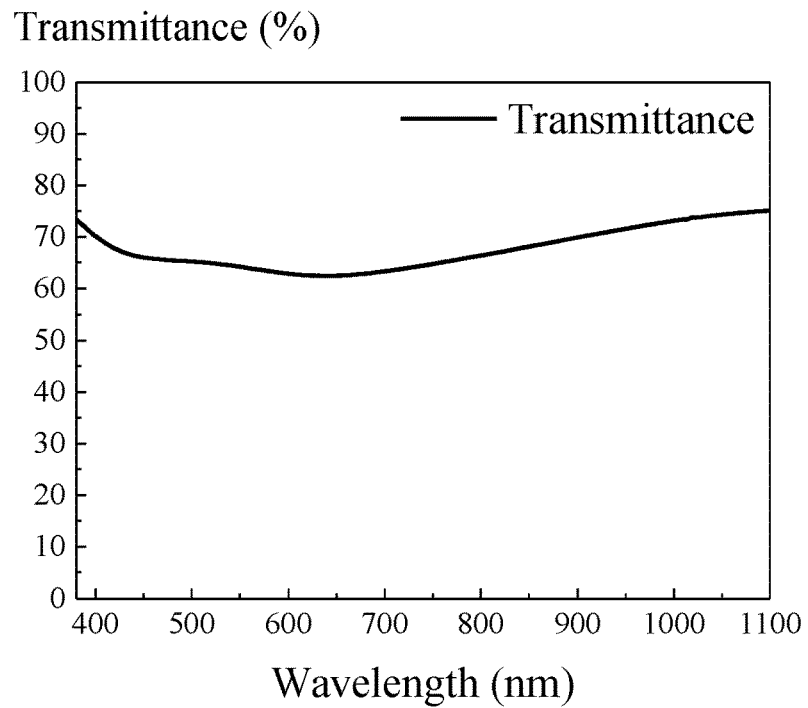
FIG. 7 is a transmission spectrum of an MoO$_x$/Ag—Al/HfO$_x$ composite film according to a sixth embodiment of the present invention in a light wave range from the visible light to the near-infrared light.

Take out the MoO$_x$/Ag—Al/HfO$_x$ composite film and measure a sheet resistance of the MoO$_x$/Ag—Al/HfO$_x$ composite film to be 13.4Ω/□ with four-probe. The transmission spectrum from the visible light to the near-infrared light (380 nm-1100 nm) is tested with a spectrometer, referring to FIG. 7. According to data of the transmission spectrum, in a range of 380 nm-1100 nm, the average transmittance from the visible light to the near-infrared light is 67.5% through arithmetic mean method.

Comparative Example

Firstly, put a clean quartz substrate into a sputtering chamber, vacuumize till a background vacuum pressure in the sputtering chamber ≤2×10$^{-3}$ Pa, and deposit an Ag—Cu film layer on the quartz substrate at a deposition rate of 1.6 Å/s through dual-target co-sputtering process, wherein an atomic mass percentage of Cu element in the Ag—Cu film layer is 5%, a temperature of the quartz substrate deposited with the Ag—Cu film layer is 35° C., and a thickness of the Ag—Cu film layer is 8 nm.

Figure 8:
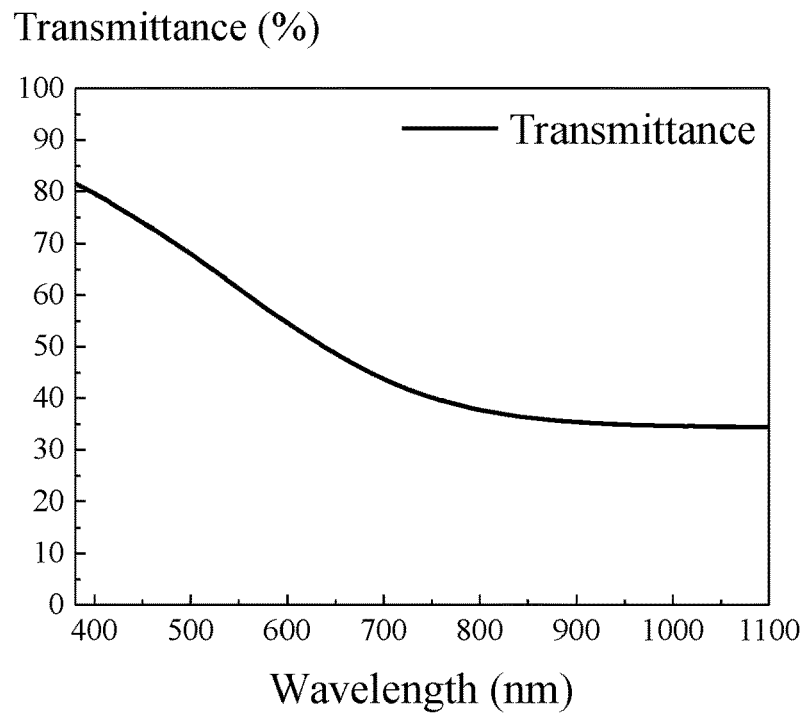
FIG. 8 is a transmission spectrum of an Ag—Cu film layer according to a comparative example of the present invention in a light wave range from the visible light to the near-infrared light.

Take out the quartz substrate deposited with the Ag—Cu film layer, and measure a sheet resistance of the quartz substrate deposited with the Ag—Cu film layer to be 18.0Ω/□ with four-probe. The transmission spectrum from the visible light to the near-infrared light (380 nm-1100 nm) is tested with a spectrometer, referring to FIG. 8. According to data of the transmission spectrum, in a range of 380 nm-1100 nm, the average transmittance from the visible light to the near-infrared light is 48.1% through arithmetic mean method.

It should be noted that those skilled in the art should understand that modifications or equivalent replacements to the technical solutions of the present invention without departing from the purpose and scope of the technical solutions of the present invention should be covered by the scope of the claims of the present invention.

What is claimed is:

1. A transparent top electrode composite film for organic optoelectronic devices, the transparent top electrode composite film comprising a substrate, an MoO$_x$ film layer coated on the substrate, a doped Ag-based film layer coated on the MoO$_x$ film layer and an HfO$_x$ film layer coated on the doped Ag-based film layer.

2. The transparent top electrode composite film according to claim 1, wherein an atomic mass percentage of a doping element in the doped Ag-based film layer is in a range of 2-10%, and an atomic mass percentage of Ag element in the doped Ag-based film layer is in a range of 90-98%.

3. The transparent top electrode composite film according to claim 2, wherein the doping element is at least one member selected from the group consisting of Cu, Al, Mo and V.

4. The transparent top electrode composite film according to claim 2, wherein a thickness of the doped Ag-based film layer is in a range of 8-15 nm.

5. The transparent top electrode composite film according to claim 1, wherein an atomic mass percentage of Mo element in the MoO$_x$ film layer is in a range of 25-30%, an atomic mass percentage of oxygen element in the MoO$_x$ film layer is in a range of 70-75%, a thickness of the MoO$_x$ film layer is in a range of 10-50 nm.

6. The transparent top electrode composite film according to claim 3, wherein an atomic mass percentage of Mo element in the MoO$_x$ film layer is in a range of 25-30%, an atomic mass percentage of oxygen element in the MoO$_x$ film layer is in a range of 70-75%, a thickness of the MoO$_x$ film layer is in a range of 10-50 nm.

7. The transparent top electrode composite film according to claim 4, wherein an atomic mass percentage of Mo element in the MoO$_x$ film layer is in a range of 25-30%, an atomic mass percentage of oxygen element in the MoO$_x$ film layer is in a range of 70-75%, a thickness of the MoO$_x$ film layer is in a range of 10-50 nm.

8. The transparent top electrode composite film according to claim 1, wherein an atomic mass percentage of Hf element in the HfO$_x$ film layer is in a range of 33-38%, an atomic mass percentage of oxygen element in the HfO$_x$ film layer is in a range of 62-67%, a thickness of the HfO$_x$ film layer is in a range of 50-150 nm.

9. The transparent top electrode composite film according to claim 4, wherein an atomic mass percentage of Hf element in the $HfO_x$ film layer is in a range of 33-38%, an atomic mass percentage of oxygen element in the $HfO_x$ film layer is in a range of 62-67%, a thickness of the $HfO_x$ film layer is in a range of 50-150 nm.

10. The transparent top electrode composite film according to claim 5, wherein an atomic mass percentage of Hf element in the $HfO_x$ film layer is in a range of 33-38%, an atomic mass percentage of oxygen element in the $HfO_x$ film layer is in a range of 62-67%, a thickness of the $HfO_x$ film layer is in a range of 50-150 nm.

11. The transparent top electrode composite film according to claim 6, wherein an atomic mass percentage of Hf element in the $HfO_x$ film layer is in a range of 33-38%, an atomic mass percentage of oxygen element in the $HfO_x$ film layer is in a range of 62-67%, a thickness of the $HfO_x$ film layer is in a range of 50-150 nm.

12. The transparent top electrode composite film according to claim 7, wherein an atomic mass percentage of Hf element in the $HfO_x$ film layer is in a range of 33-38%, an atomic mass percentage of oxygen element in the $HfO_x$ film layer is in a range of 62-67%, a thickness of the $HfO_x$ film layer is in a range of 50-150 nm.

* * * * *